(12) United States Patent
Ozeki et al.

(10) Patent No.: US 9,882,119 B2
(45) Date of Patent: Jan. 30, 2018

(54) MAGNETIC MEMORY DEVICE

(71) Applicant: Toshiba Memory Corporation, Minato-ku, Tokyo (JP)

(72) Inventors: Jyunichi Ozeki, Seoul (KR); Hiroyuki Ohtori, Seoul (KR); Kuniaki Sugiura, Seoul (KR); Yutaka Hashimoto, Kimitsu Chiba (JP); Katsuya Nishiyama, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/270,672

(22) Filed: Sep. 20, 2016

(65) Prior Publication Data

US 2017/0263852 A1    Sep. 14, 2017

Related U.S. Application Data

(60) Provisional application No. 62/308,151, filed on Mar. 14, 2016.

(51) Int. Cl.
| | | |
|---|---|---|
| *H01L 29/82* | (2006.01) | |
| *H01L 43/02* | (2006.01) | |
| *H01L 27/22* | (2006.01) | |
| *H01L 43/08* | (2006.01) | |
| *H01L 43/10* | (2006.01) | |
| *H01L 43/12* | (2006.01) | |

(52) U.S. Cl.
CPC ............ *H01L 43/02* (2013.01); *H01L 27/228* (2013.01); *H01L 43/08* (2013.01); *H01L 43/10* (2013.01); *H01L 43/12* (2013.01)

(58) Field of Classification Search
CPC ......... H01L 43/02; H01L 43/08; H01L 43/10; H01L 43/12; H01L 27/228
USPC .................................... 257/421, 295
See application file for complete search history.

(56) References Cited

U.S. PATENT DOCUMENTS

| | | | |
|---|---|---|---|
| 8,716,818 B2 | 5/2014 | Yoshikawa et al. | |
| 8,878,321 B2 | 11/2014 | Aikawa et al. | |
| 8,884,389 B2 | 11/2014 | Toko et al. | |
| 2010/0080050 A1 | 4/2010 | Ozeki et al. | |
| 2013/0069186 A1* | 3/2013 | Toko ...................... | H01L 43/08 257/425 |
| 2014/0077319 A1 | 3/2014 | Noma et al. | |

* cited by examiner

*Primary Examiner* — Tu-Tu Ho
(74) *Attorney, Agent, or Firm* — Holtz Holtz & Volek PC

(57) ABSTRACT

According to one embodiment, a magnetic memory device includes a first magnetic layer selectively exhibiting a first state in which the first magnetic layer has a first magnetization direction perpendicular to a main surface thereof and a second state in which the first magnetic layer has a second magnetization direction opposite to the first magnetization direction, a second magnetic layer having a fixed magnetization direction perpendicular to a main surface thereof and corresponding to the first magnetization direction, a third magnetic layer provided between the first and second magnetic layers, having a fixed magnetization direction perpendicular to a main surface thereof and corresponding to the second magnetization direction, and having a side surface including a recess portion, and a nonmagnetic layer provided between the first and third magnetic layers.

20 Claims, 20 Drawing Sheets

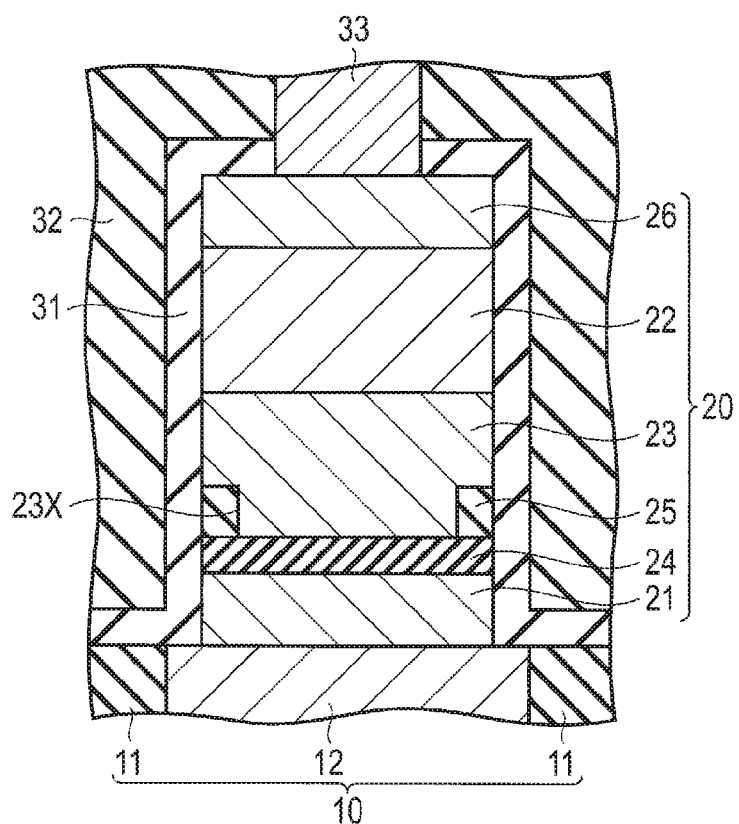
F I G. 1
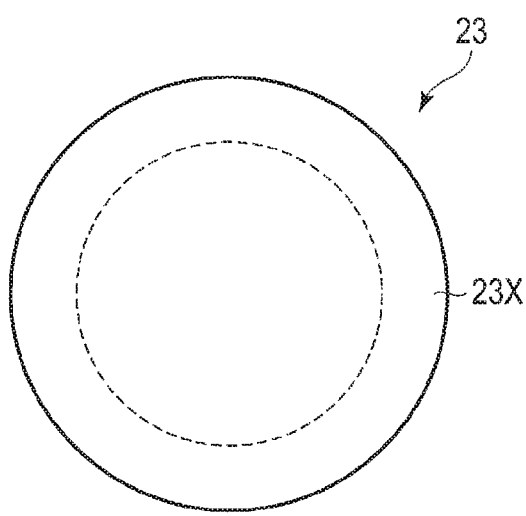
F I G. 2

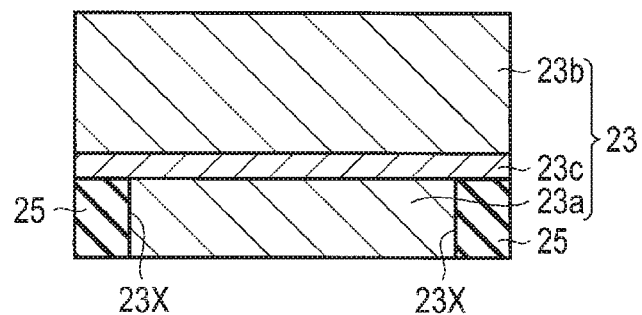
F I G. 3
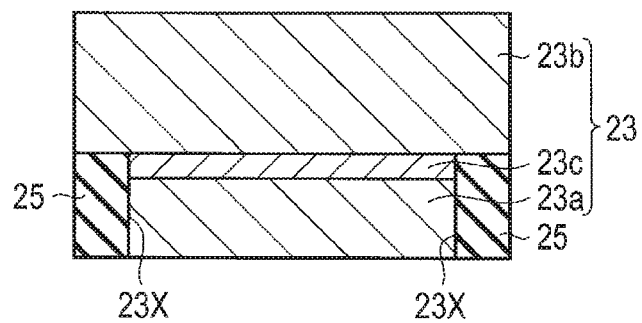
F I G. 4
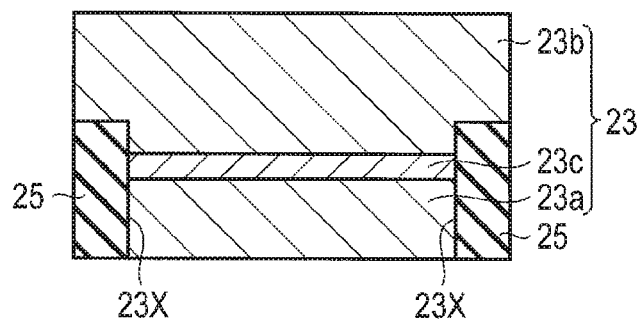
F I G. 5

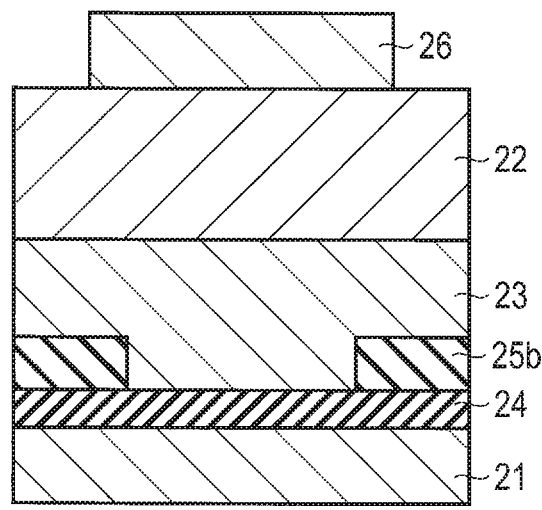
F I G. 14
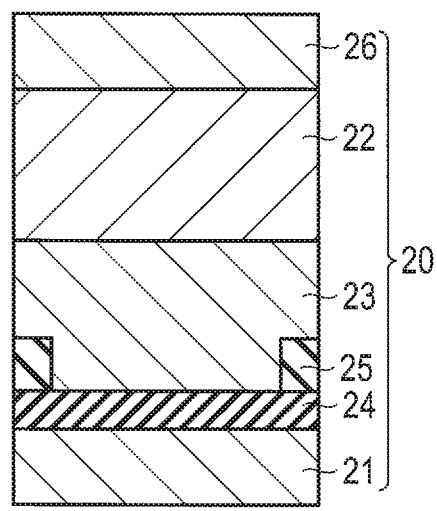
F I G. 15

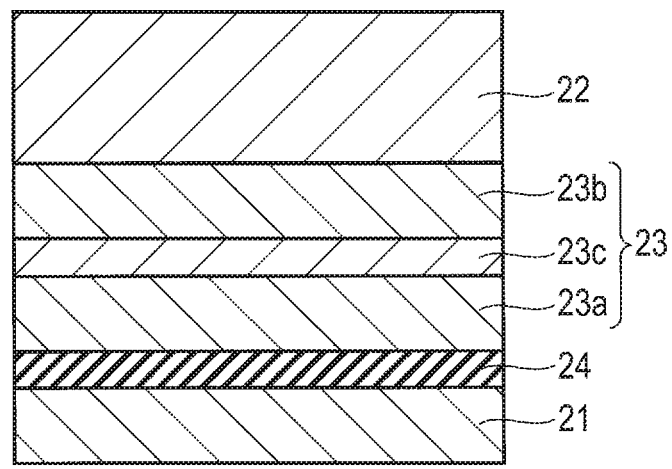
F I G. 15A
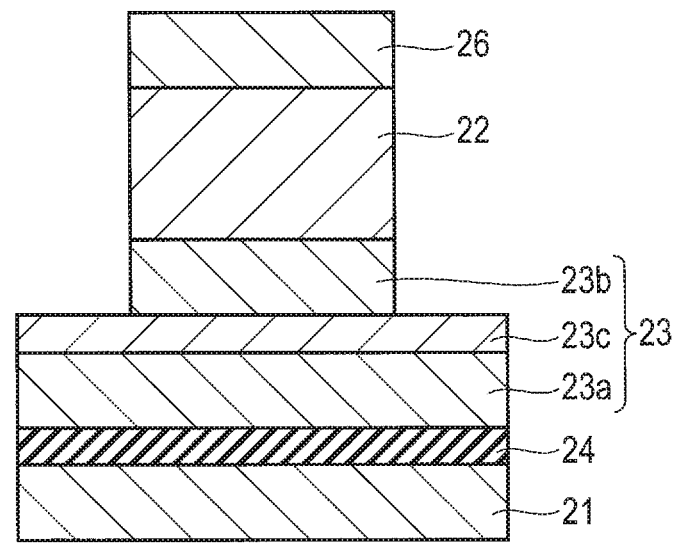
F I G. 15B

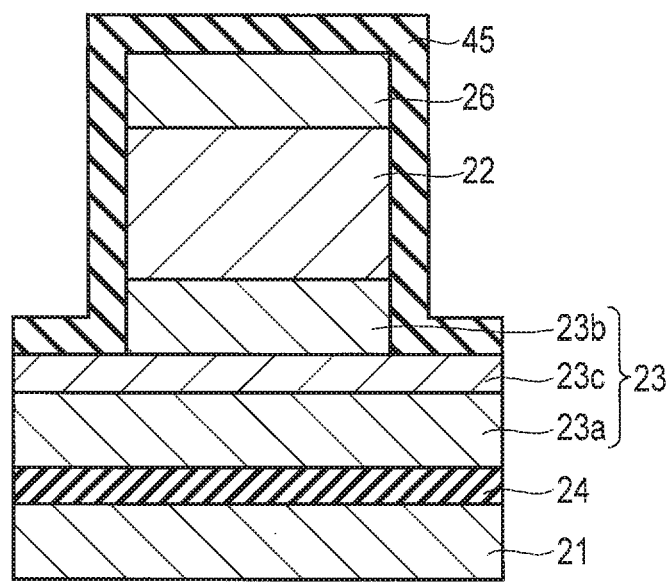
F I G. 15C
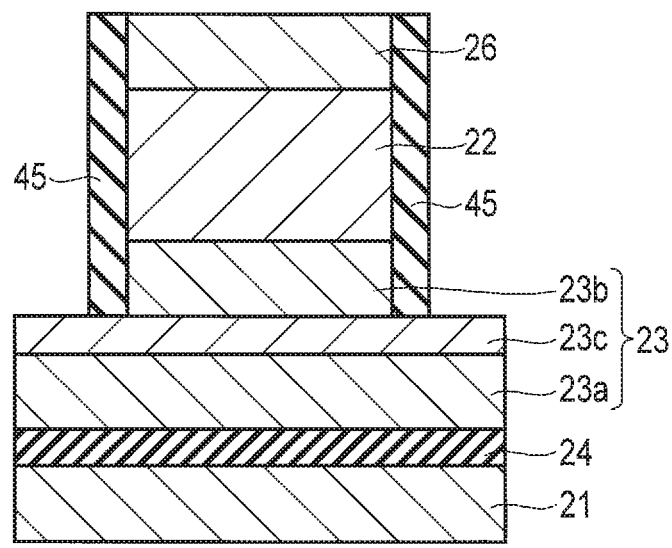
F I G. 15D

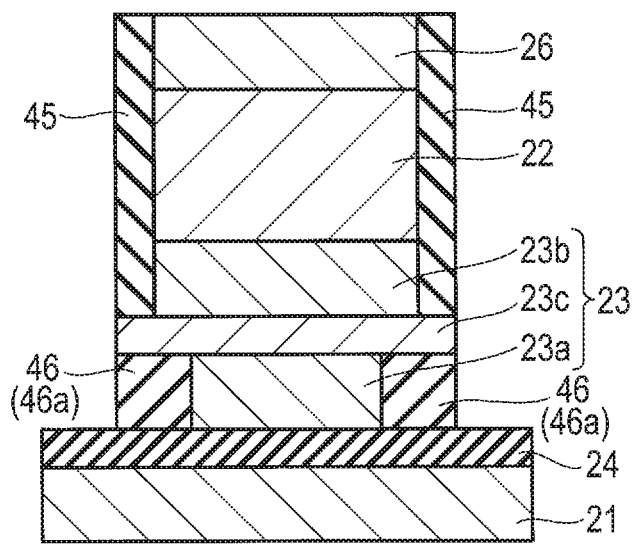
F I G. 15J
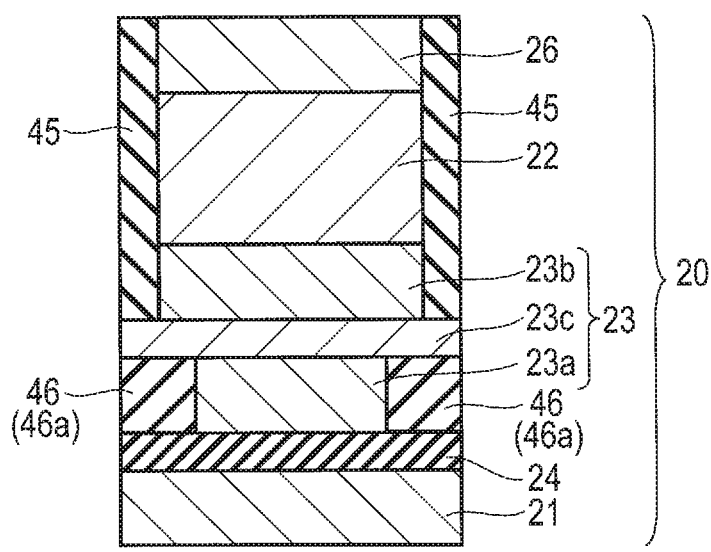
F I G. 15K

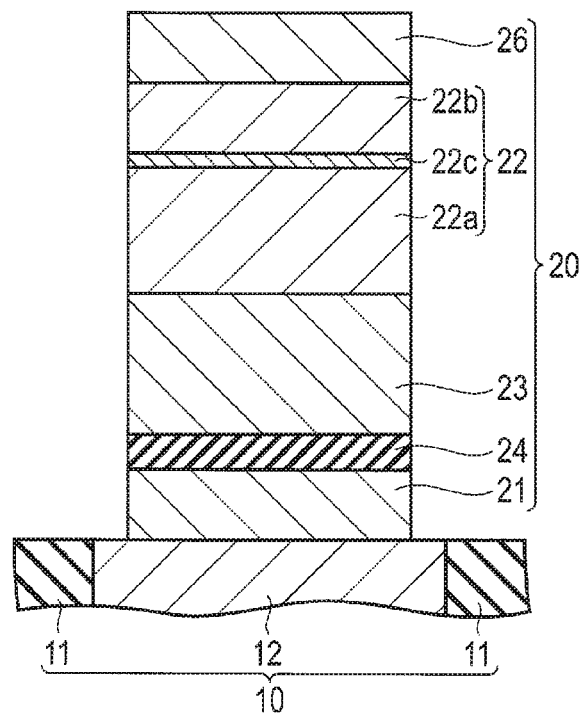
F I G. 21
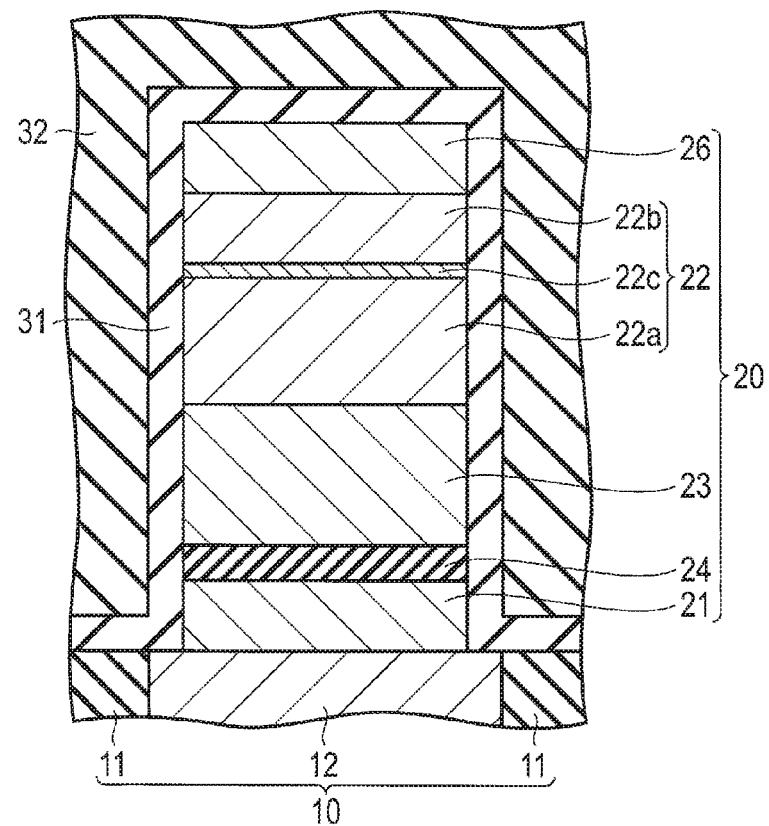
F I G. 22

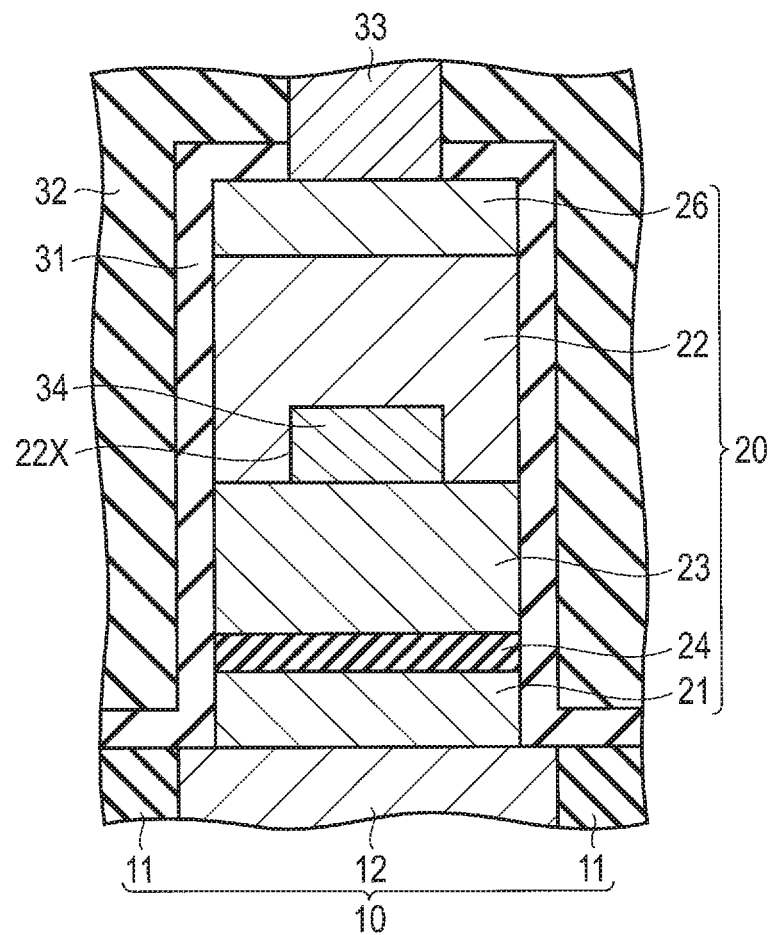
F I G. 24

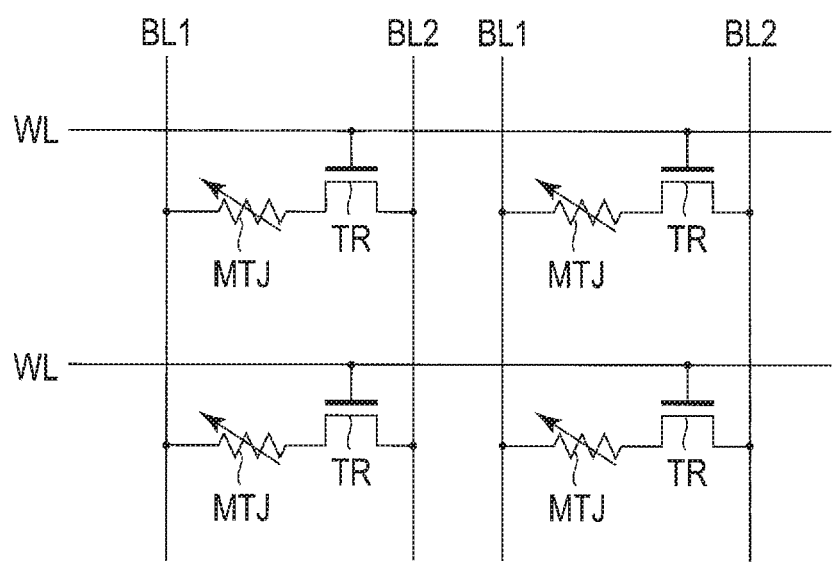
F I G. 25

MAGNETIC MEMORY DEVICE

CROSS-REFERENCE TO RELATED APPLICATIONS

This application claims the benefit of U.S. Provisional Application No. 62/308,151, filed Mar. 14, 2016, the entire contents of which are incorporated herein by reference.

FIELD

Embodiments described herein relate generally to a magnetic memory device.

BACKGROUND

A magnetic memory device (semiconductor integrated circuit device) comprising magnetoresistive elements and transistors integrated on a semiconductor substrate has been proposed.

The magnetoresistive element has a basic structure including a storage layer having a variable magnetization direction, a reference layer having a fixed magnetization direction, and a tunnel barrier layer provided between the storage layer and the reference layer. In addition, generally, a shift canceling layer is also provided in the magnetoresistive element to cancel the magnetic field applied from the reference layer to the storage layer.

However, distribution of the magnetic field applied to the storage layer can hardly be improved even if the shift canceling layer is provided.

BRIEF DESCRIPTION OF THE DRAWINGS

FIG. 1 is a cross-sectional view schematically showing a configuration of a magnetic memory device according to a first embodiment.

FIG. 2 is a plan view pictorially showing a relationship between a reference layer and a recess portion, in the magnetic memory device according to the first embodiment.

FIG. 3 is a cross-sectional view pictorially showing a first configuration example of the reference layer and an inactive portion, according to the first embodiment.

FIG. 4 is a cross-sectional view pictorially showing a second configuration example of the reference layer and the inactive portion, according to the first embodiment.

FIG. 5 is a cross-sectional view pictorially showing a third configuration example of the reference layer and the inactive portion, according to the first embodiment.

FIG. 14 is a cross-sectional view pictorially showing in part the second method of manufacturing the magnetic memory device according to the first embodiment.

FIG. 15 is a cross-sectional view pictorially showing in part the second method of manufacturing the magnetic memory device according to the first embodiment.

FIG. 15A is a cross-sectional view pictorially showing in part a third method of manufacturing the magnetic memory device according to the first embodiment.

FIG. 15B is a cross-sectional view pictorially showing in part the third method of manufacturing the magnetic memory device according to the first embodiment.

FIG. 15C is a cross-sectional view pictorially showing in part the third method of manufacturing the magnetic memory device according to the first embodiment.

FIG. 15D is a cross-sectional view pictorially showing in part the third method of manufacturing the magnetic memory device according to the first embodiment.

FIG. 15J is a cross-sectional view pictorially showing in part a modification of the third method of manufacturing the magnetic memory device according to the first embodiment.

FIG. 15K is a cross-sectional view pictorially showing in part the modification of the third method of manufacturing the magnetic memory device according to the first embodiment.

FIG. 21 is a cross-sectional view pictorially showing in part a method of manufacturing the magnetic memory device according to the second embodiment.

FIG. 22 is a cross-sectional view pictorially showing in part the method of manufacturing the magnetic memory device according to the second embodiment.

FIG. 24 is a cross-sectional view pictorially showing a modified example of the configuration of the magnetic memory device according to the second embodiment.

FIG. 25 is an equivalent circuit diagram showing a configuration of a magnetic memory device (semiconductor integrated circuit device) using the magnetoresistive elements according to the first and second embodiments.

DETAILED DESCRIPTION

Figure 6:
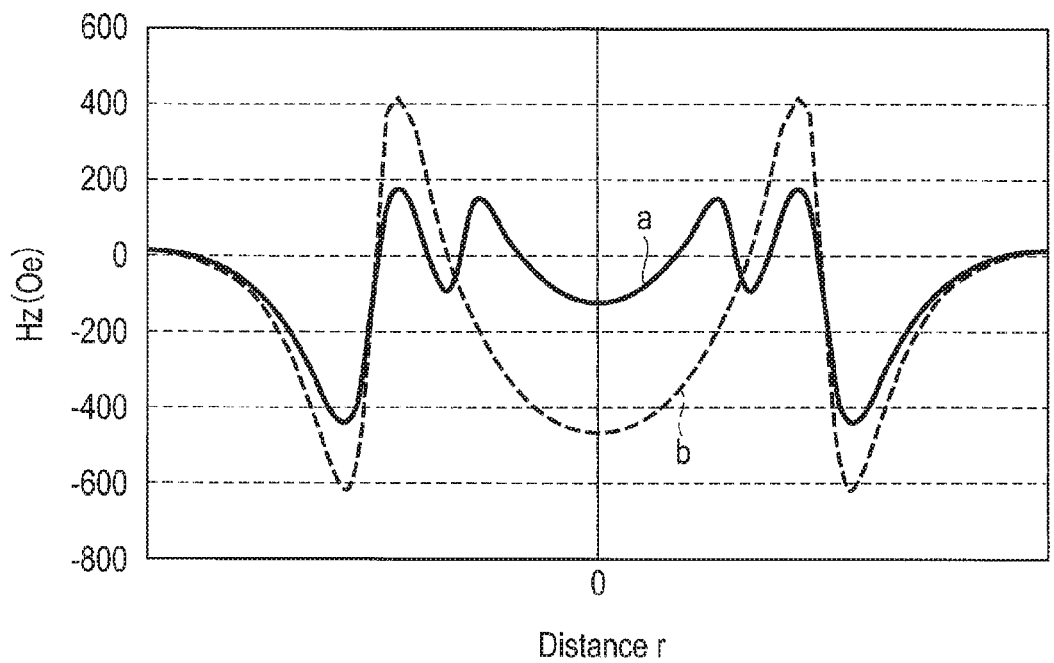
FIG. 6 is a graph showing a spatial distribution of a stray magnetic field in the magnetic memory device according to the first embodiment.

In general, according to one embodiment, a magnetic memory device includes: a first magnetic layer selectively exhibiting a first state in which the first magnetic layer has a first magnetization direction perpendicular to a main surface thereof and a second state in which the first magnetic layer has a second magnetization direction opposite to the first magnetization direction; a second magnetic layer having a fixed magnetization direction which is perpendicular to a main surface thereof and which corresponds to the first magnetization direction; a third magnetic layer provided between the first magnetic layer and the second magnetic layer, having a fixed magnetization direction which is perpendicular to a main surface thereof and which corresponds to the second magnetization direction, and having a side surface including a recess portion; and a nonmagnetic layer provided between the first magnetic layer and the third magnetic layer.

Embodiments will be described hereinafter with reference to the accompanying drawings.

First Embodiment

FIG. 1 is a cross-sectional view pictorially showing a configuration of a magnetic memory device according to a first embodiment.

A stacked layer structure 20 which functions as a magnetoresistive element is provided on an underlying region 10 including an interlayer insulating film 11 and a bottom electrode 12. The magnetoresistive element is also called a magnetic tunnel junction (MTJ) element.

The stacked layer structure 20 includes a storage layer (first magnetic layer) 21, a shift canceling layer (second magnetic layer) 22, a reference layer (third layer) 23 provided between the storage layer 21 and the shift canceling layer 22, a tunnel barrier layer (nonmagnetic layer) 24 provided between the storage layer 21 and the reference layer 23, an inactive portion 25 provided in a recess portion 23x of a side surface of the reference layer 23, and a top layer 26 provided on the shift canceling layer 22. A nonmagnetic layer formed of Ru or the like may be provided between the shift canceling layer 22 and the reference layer 23.

The storage layer (first magnetic layer) 21 has a variable magnetization direction. More specifically, the storage layer 21 selectively exhibits a first state in which the storage layer 21 has a first magnetization direction perpendicular to the main surface thereof and a second state in which the storage layer 21 has a second magnetization direction perpendicular to the main surface thereof. The second magnetization direction is opposite to the first magnetization direction. In other words, the second magnetization direction is anti-parallel to the first magnetization direction and different from the first magnetization direction by 180 degrees. The storage layer 21 is formed of, for example, a ferromagnetic material such as CoFeB or FeB.

The shift canceling layer (second magnetic layer) 22 has a fixed magnetization direction which is perpendicular to the main surface thereof and which corresponds to the first magnetization direction. The shift canceling layer 22 is formed of, for example, a ferromagnetic material such as CoPt, CoNi or CoPd.

The reference layer (third magnetic layer) 23 has a fixed magnetization direction which is perpendicular to the main surface thereof and which corresponds to the second magnetization direction. A side surface of the reference layer 23 includes the recess portion 23x. In other words, the side surface of the reference layer 23 is partially recessed.

As understood from the above, the magnetization direction of the shift canceling layer 22 is opposite to the magnetization direction of the reference layer 23. In other words, the magnetization direction of the shift canceling layer 22 is anti-parallel to the magnetization direction of the reference layer 23. For this reason, the magnetic field applied from the reference layer 23 to the storage layer 21 can be canceled by the magnetic field applied from the shift canceling layer 22 to the storage layer 21.

FIG. 2 is a plan view pictorially showing a relationship between the reference layer 23 and the recess portion 23x. As shown in FIG. 2, the recess portion 23x is shaped in a ring as viewed from a direction perpendicular to the main surface of the reference layer 23. In the present embodiment, the recess portion 23x is provided at a lowermost part of the side surface of the reference layer 23. An inner surface of the recess portion 23x is therefore defined by the reference layer 23 and the tunnel barrier layer 24. The inactive portion 25 which will be explained later is provided in the recess portion 23x.

The side surface of the reference layer 23 except the recess portion 23x aligns with the side surface of the shift canceling layer 22. The area of the top surface of the reference layer 23 is equal to the area of the bottom surface of the shift canceling layer 22. In addition, since the recess portion 23x is provided at the lowermost part of the side surface of the reference layer 23, the area of the bottom surface of the reference layer 23 is smaller than the area of the top surface of the reference layer 23.

FIG. 3, FIG. 4 and FIG. 5 are cross-sectional views pictorially showing a more specific configuration of the reference layer 23 and the inactive portion 25.

As shown in FIG. 3, FIG. 4 and FIG. 5, the reference layer 23 includes a lower layer portion 23a, an upper layer portion 23b, and a middle layer portion 23c provided between the lower layer portion 23a and the upper layer portion 23b. The lower layer portion 23a is formed of, for example, a ferromagnetic material such as CoFeB or FeB. The upper layer portion 23b is formed of, for example, a ferromagnetic material such as CoPt, CoNi or CoPd. The middle layer portion 23c is formed of, for example, a metal such as Ta, Zr, W, Hf, Mo, Nb, Ti, V or Cr.

In the configuration example shown in FIG. 3, the recess portion 23x is located at the lower layer portion 23a of the reference layer 23, and the inactive portion 25 is provided in the recess portion 23x located at the lower layer portion 23a. In the configuration example shown in FIG. 4, the recess portion 23x is located at the lower layer portion 23a and the middle layer portion 23c of the reference layer 23, and the inactive portion 25 is provided in the recess portion 23x located at the lower layer portion 23a and the middle layer portion 23c. In the configuration example shown in FIG. 5, the recess portion 23x is located at the lower layer portion 23a, the middle layer portion 23c and a part of the upper layer portion 23b of the reference layer 23, and the inactive portion 25 is provided in the recess portion 23x located at the lower layer portion 23a, the middle layer portion 23c and a part of the upper layer portion 23b.

The tunnel barrier layer (nonmagnetic layer) 24 is provided between the storage layer 21 and the reference layer 23 as shown in FIG. 1. The tunnel barrier layer 24 is formed of, for example, an insulating material such as MgO.

The inactive portion 25 is provided in the recess portion 23x at the side surface of the reference layer 23 and is magnetically inactive. Since the recess portion 23x is shaped in a ring as viewed from a direction perpendicular to the main surface of the reference layer 23 as already explained, the inactive portion 25 is also shaped in a ring. In addition, since the recess portion 23x is provided at the lowermost portion of the side surface of the reference layer 23, in the present embodiment, the inactive portion 25 is in contact with the tunnel barrier layer 24. The inactive portion 25 may be magnetically inactive and may be formed of an insulating material or a conductive material.

The top layer 26 functions as a cap layer or a hard mask layer and is formed of, for example, a metallic material such as Ta or Ru.

A spin-transfer-torque (STT) magnetoresistive element is constituted by the stacked layer structure 20 including the storage layer 21, the shift canceling layer 22, the reference layer 23, the tunnel barrier layer 24, the inactive portion 25, and the top layer 26.

The stacked layer structure 20 is covered with a protective insulating film 31 and an interlayer insulating film 32. A top electrode 33 is provided in a hole formed in the protective insulating film 31 and the interlayer insulating film 32 and is connected to the top layer 26.

The above-explained magnetoresistive element (MTJ element) is a magnetic element having a perpendicular magnetization. If the magnetization direction of the storage layer 21 and the magnetization direction of the reference layer 23 are parallel to each other, the magnetoresistive element becomes in a low-resistance state. If the magnetization direction of the storage layer 21 and the magnetization direction of the reference layer 23 are anti-parallel, the magnetoresistive element becomes in a high-resistance state. Binary information (0 or 1) can be stored in accordance with the low-resistance state or the high-resistance state of the magnetoresistive element. In addition, the binary information (0 or 1) can be written in accordance with a direction of the current flowing to the magnetoresistive element.

FIG. 6 is a graph showing a spatial distribution of a stray magnetic field in the magnetic memory device according to the present embodiment. More specifically, the figure shows a magnetic field intensity distribution corresponding to a difference between the magnetic field applied from the shift canceling layer 22 to the storage layer 21 (i.e., the magnetic field in the direction perpendicular to the main surface of the storage layer 21) and the magnetic field applied from the reference layer 23 to the storage layer 21 (i.e., the magnetic field in the direction perpendicular to the main surface of the storage layer 21). The horizontal axis indicates a distance from a center (r=0) of the main surface of the storage layer 21 and the vertical axis indicates the magnetic field intensity. A position represented by a broken line corresponds to the edge of the storage layer 21. Characteristic "a" indicates the magnetic field intensity distribution in the present embodiment (in which the recess portion 23x and the inactive portion 25 are provided), and characteristic "b" indicates the magnetic field intensity distribution in a comparative example (in which none of the recess portion 23x and the inactive portion 25 is provided).

As shown in FIG. 6, the variation in the magnetic field intensity in the present embodiment (characteristic "a") is reduced more significantly than that in the comparative example (characteristic "b"). The variation in intensity of the magnetic field applied from the shift canceling layer 22 and the reference layer 23 to the storage layer 21 can be therefore reduced by employing the constitution of the present embodiment.

Thus, in the magnetic memory device of the present embodiment, the recess portion 23x is provided at the side surface of the reference layer 23, and the inactive portion 25 which is magnetically inactive is provided in the recess portion 23x. In the constitution of the present embodiment, the variation in intensity of the magnetic field applied from the shift canceling layer 22 and the reference layer 23 to the storage layer 21 can be reduced and the distribution of the magnetic field applied to the storage layer 21 can be improved significantly. A magnetic memory device having excellent characteristics can be therefore obtained by employing the configuration of the present embodiment.

In addition, in the present embodiment, a switching current can be reduced at the writing since the variation in intensity of the magnetic field applied to the storage layer 21 can be reduced. Moreover, in the present embodiment, the area of the lower part of the reference layer 23 can be reduced and the spin transfer efficiency can be increased by the current constriction effect since the recess portion 23x is provided at the lower part of the side surface of the reference layer 23. Furthermore, in the present embodiment, the thickness of the shift canceling layer 22 can be reduced since the volume of the reference layer 23 is reduced by providing the recess portion 23x.

Next, a first method of manufacturing the magnetic memory device according to the present embodiment will be explained. FIG. 7 to FIG. 11 are cross-sectional views pictorially showing the first manufacturing method.

Figure 7:
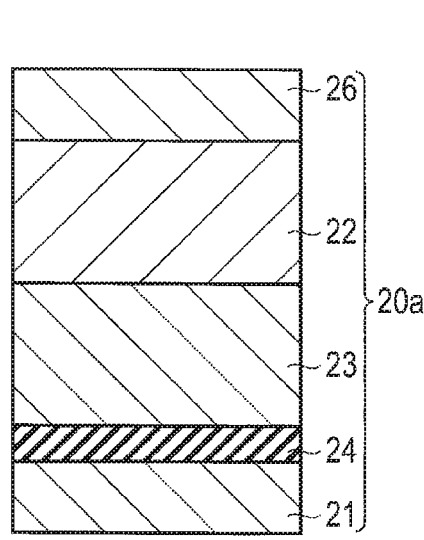
FIG. 7 is a cross-sectional view pictorially showing in part a first method of manufacturing the magnetic memory device according to the first embodiment.

First, as shown in FIG. 7, the storage layer 21, the tunnel barrier layer 24, the reference layer 23, the shift canceling layer 22 and the top layer 26 are formed on the underlying region (not shown). Subsequently, the top layer 26 is patterned, and the storage layer 21, the tunnel barrier layer 24, the reference layer 23, and the shift canceling layer 22 are etched by using the patterned top layer 26 as a mask. A stacked layer structure 20a is thereby formed.

Figure 8:
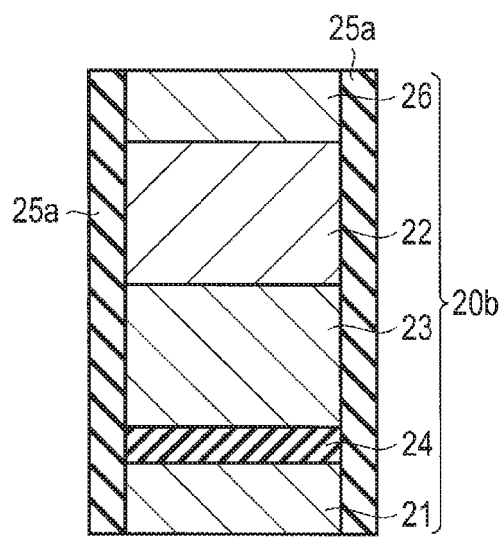
FIG. 8 is a cross-sectional view pictorially showing in part the first method of manufacturing the magnetic memory device according to the first embodiment.

Next, a sidewall portion of the stacked layer structure 20a is oxidized as shown in FIG. 8. An inactive layer 25a is thereby formed on the sidewall of a stacked layer structure 20b.

Figure 9:
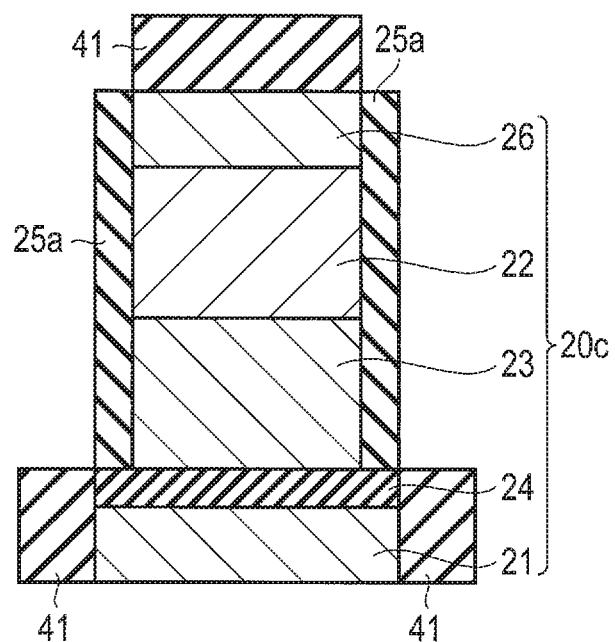
FIG. 9 is a cross-sectional view pictorially showing in part the first method of manufacturing the magnetic memory device according to the first embodiment.

Next, as shown in FIG. 9, a reducible first insulating film 41 is formed and the inactive layer 25a is subjected to reduction treatment. A part of the inactive layer 25a (i.e., a part formed on the side surface of the storage layer 21 and the side surface of the tunnel barrier layer 24) is thereby reduced and a stacked layer structure 20c can be obtained.

Figure 10:
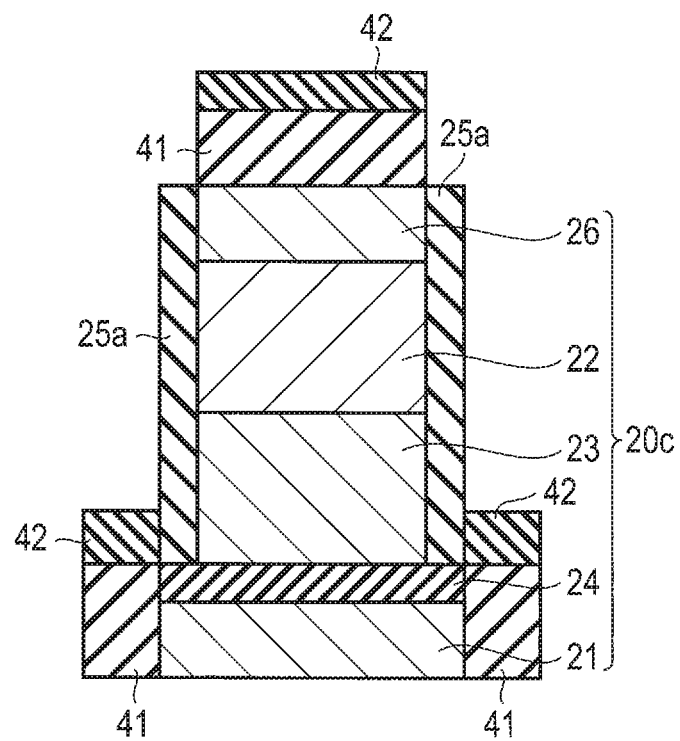
FIG. 10 is a cross-sectional view pictorially showing in part the first method of manufacturing the magnetic memory device according to the first embodiment.

Next, as shown in FIG. 10, an irreducible second insulating film 42 is formed on the first insulating film 41.

Figure 11:
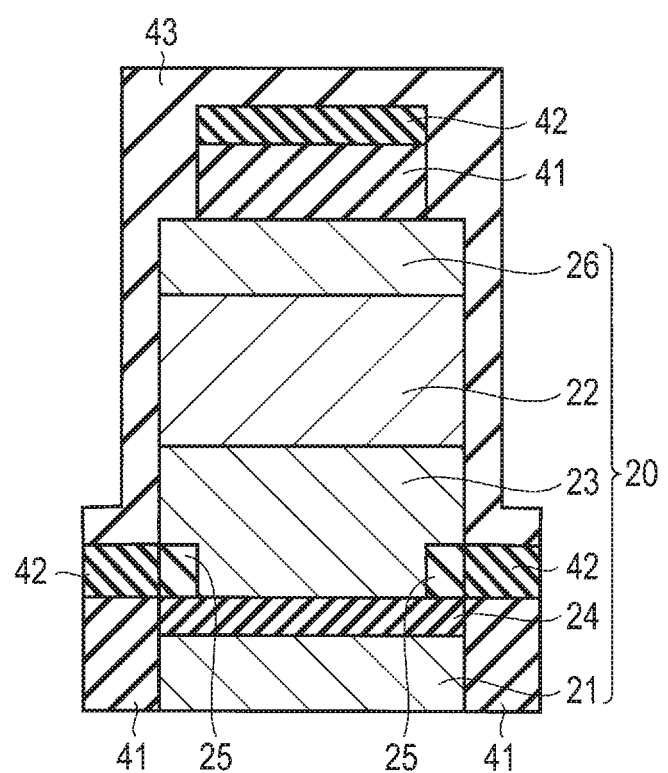
FIG. 11 is a cross-sectional view pictorially showing in part the first method of manufacturing the magnetic memory device according to the first embodiment.

Next, as shown in FIG. 11, a reducible third insulating film 43 is formed and the inactive layer 25a is subjected to reduction treatment. Parts of the inactive layer 25a (i.e., parts formed on the side surface of the upper part of the reference layer 23, the side surface of the shift canceling layer 22, and the side surface of the top layer 26) are thereby reduced. As a result, the stacked layer structure 20 including the inactive portion 25 can be obtained. As understood from the above-explained manufacturing method, the inactive portion 25 is formed of an oxide of the material used for the reference layer 23.

Thus, the stacked layer structure 20 including the inactive portion 25 can be formed by combining the oxidation treatment and the reduction treatment, in the first manufacturing method.

Next, a second method of manufacturing the magnetic memory device according to the present embodiment will be explained. FIG. 12 to FIG. 15 are cross-sectional views pictorially showing the second manufacturing method.

Figure 12:
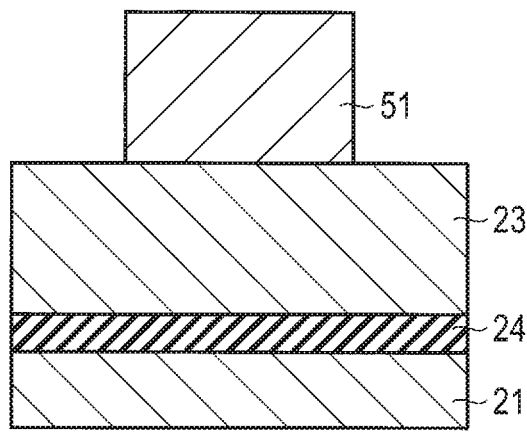
FIG. 12 is a cross-sectional view pictorially showing in part a second method of manufacturing the magnetic memory device according to the first embodiment.

First, as shown in FIG. 12, the storage layer 21, the tunnel barrier layer 24, and the reference layer 23 are formed on the underlying region (not shown). Subsequently, a hard mask pattern 51 is formed on the reference layer 23.

Figure 13:
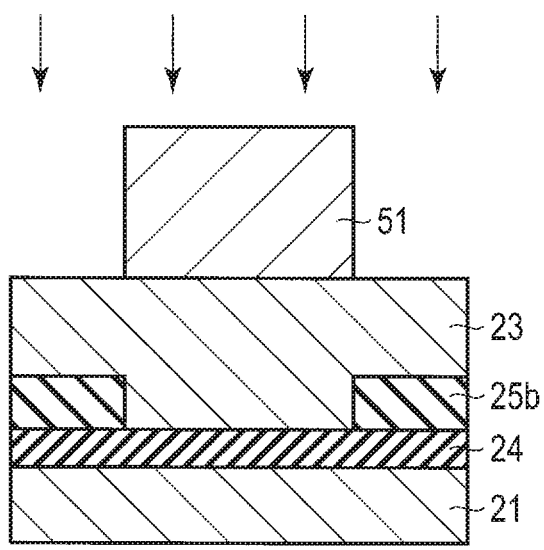
FIG. 13 is a cross-sectional view pictorially showing in part the second method of manufacturing the magnetic memory device according to the first embodiment.

Next, as shown in FIG. 13, ions of a predetermined element are implanted into the reference layer 23 by using the hard mask pattern 51 as a mask. An inactive layer 25b having an amorphous structure is thereby formed at the ion-implanted portion of the reference layer 23.

Next, as shown in FIG. 14, the hard mask pattern 51 is removed and the shift canceling layer 22 is formed on the reference layer 23. Furthermore, a top layer 26 which functions as a hard mask is formed on the shift canceling layer 22.

Next, as shown in FIG. 15, the shift canceling layer 22, the reference layer 23, the inactive layer 25b, the tunnel barrier layer 24, and the storage layer 21 are etched by using the top layer 26 as a mask. As a result, the stacked layer structure 20 including the inactive portion 25 can be obtained. The inactive portion 25 has an amorphous structure and is formed of substantially the same material as that used for the reference layer 23. In other words, the material of the inactive portion 25 is obtained by adding the predetermined element (ion implantation element) to the material of the reference layer 23.

Thus, the stacked layer structure 20 including the inactive portion 25 can be formed by combining the ion implantation treatment, in the second manufacturing method.

Next, a third method of manufacturing the magnetic memory device according to the present embodiment will be explained. FIG. 15A to FIG. 15H are cross-sectional views pictorially showing the third manufacturing method.

First, as shown in FIG. 15A, the storage layer 21, the tunnel barrier layer 24, the reference layer 23, and the shift canceling layer 22 are formed on the underlying region (not shown). In the present manufacturing method, the reference layer 23 includes a lower layer portion 23a, an upper layer portion 23b, and a middle layer portion 23c. The lower layer portion 23a and the upper layer portion 23b are magnetic layers, and the middle layer portion 23c is a nonmagnetic layer. A nonmagnetic layer may be formed between the reference layer 23 and the shift canceling layer 22.

Next, as shown in FIG. 15B, a top layer 26 which functions as a hard mask is formed on the shift canceling layer 22. Subsequently, the shift canceling layer 22 and the upper layer portion 23b of the reference layer 23 are etched by using the top layer 26 as a mask. In this way, a stacked layer structure formed of the top layer 26, the shift canceling layer 22, and the upper layer portion 23b of the reference layer 23 are obtained.

Next, as shown in FIG. 15C, an insulating film 45 covering the above described stacked layer structure is formed. The insulating film 45 is magnetically inactive.

Next, as shown in FIG. 15D, an etch-back process is performed to leave the insulating film 45 only on a side surface of the stacked layer structure.

Figure 15E:
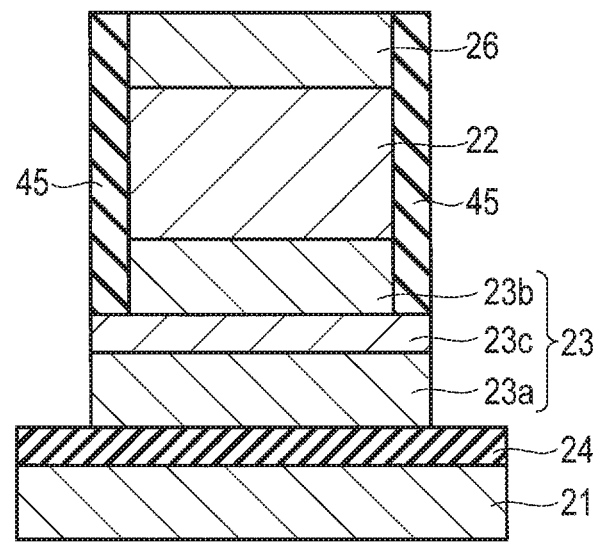
FIG. 15E is a cross-sectional view pictorially showing in part the third method of manufacturing the magnetic memory device according to the first embodiment.

Next, as shown in FIG. 15E, the middle layer portion 23c and the lower layer portion 23a of the reference layer 23 are etched by using the insulating film 45 as a mask. The insulating film 45 is required to have an etching rate smaller than that of the middle layer portion 23c and that of the lower layer portion 23a of the reference layer 23. For example, the insulating film 45 is a silicon nitride film.

Figure 15F:
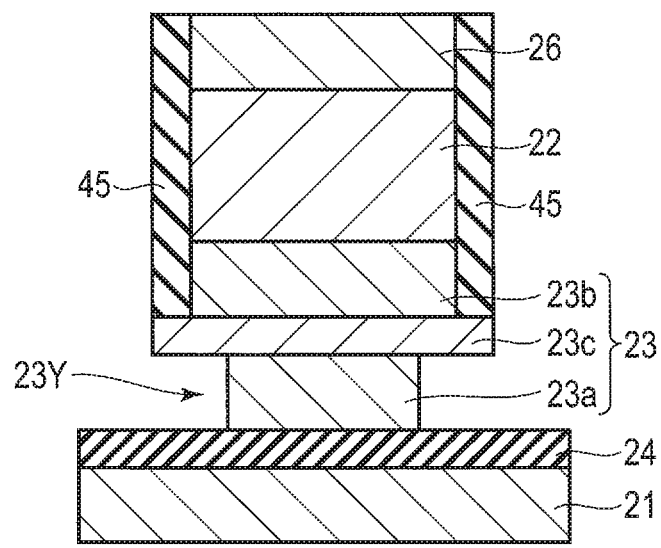
FIG. 15F is a cross-sectional view pictorially showing in part the third method of manufacturing the magnetic memory device according to the first embodiment.

Next, as shown in FIG. 15F, the lower layer portion 23a of the reference layer 23 are etched selectively with respect to the tunnel barrier layer 24, the middle layer portion 23c of the reference layer 23, and the insulating film 45. As a result, the size of the lower layer portion 23a of the reference layer 23 is reduced, and a recess portion 23Y is formed.

Figure 15G:
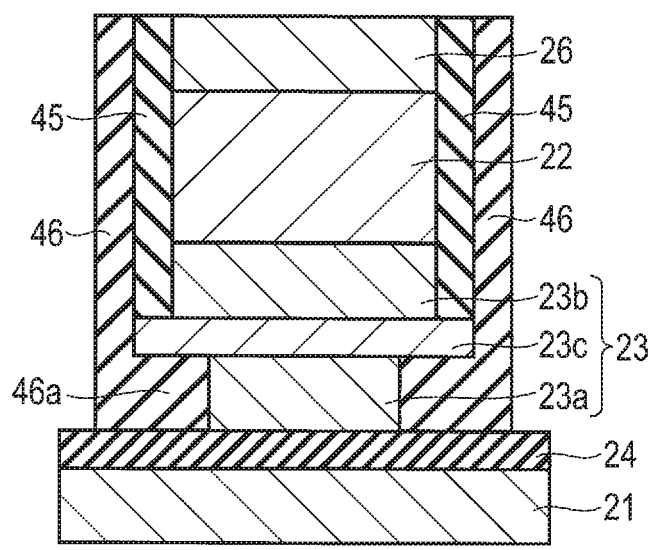
FIG. 15G is a cross-sectional view pictorially showing in part the third method of manufacturing the magnetic memory device according to the first embodiment.

Next, as shown in FIG. 15G, an insulating film 46 which is magnetically inactive is formed on a entire surface, and an etch back process is performed. By this process, the insulating film 46 is left only on side surfaces of the lower layer portion 23a and the middle layer portion 23c of the reference layer 23 and the insulating film 45. The recess portion 23Y is filled with the insulating film 46, and an inactive portion 46a which is magnetically inactive is obtained.

Figure 15H:
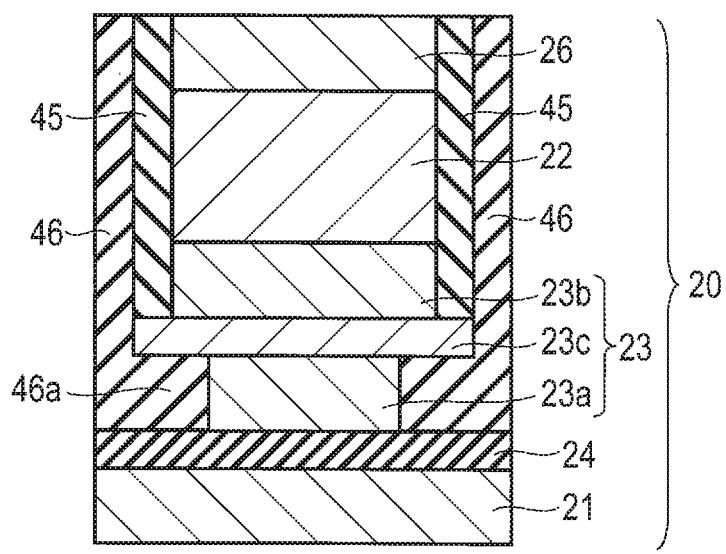
FIG. 15H is a cross-sectional view pictorially showing in part the third method of manufacturing the magnetic memory device according to the first embodiment.

Next, as shown in FIG. 15H, the tunnel barrier layer 24, and the storage layer 21 are etched by using the insulating film 46 as a mask. As a result, the stacked layer structure 20 including the inactive portion 46a is obtained. The insulating film 46 is required to have an etching rate smaller than that of the tunnel barrier layer 24 and that of the storage layer 21. For example, the insulating film 46 is a silicon nitride film.

Figure 15I:
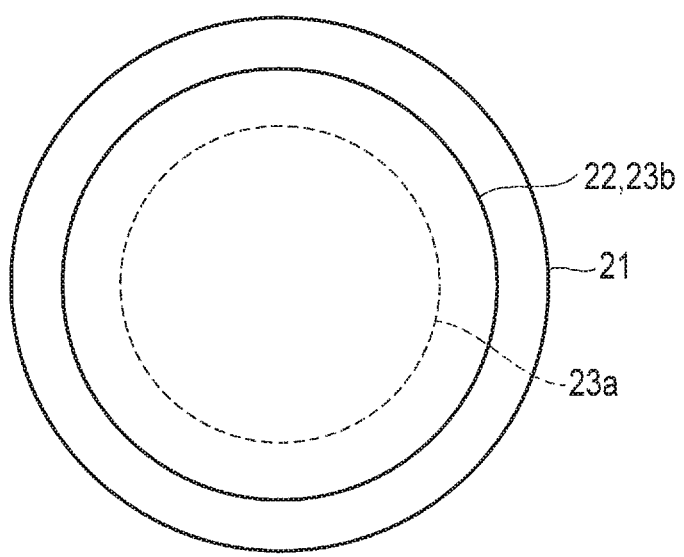
FIG. 15I is a plan view pictorially showing a relationship of a storage layer, a reference layer and a shift canceling layer, in the third method of manufacturing the magnetic memory device according to the first embodiment.

FIG. 15I is a plan view pictorially showing a relationship of a storage layer 21, a shift canceling layer 22, and a reference layer 23 in the present manufacturing method. As can be understood from FIG. 15H and FIG. 15I, a side surface of the storage layer 21 is located outside a side surface of the shift canceling layer 22 and a side surface of the reference layer 23 as viewed from a direction perpendicular to a main surface of the storage layer 21.

As described above, in the third manufacturing method, the stacked layer structure 20 including the inactive portion 46a can be formed by performing an etching using each of the insulating films 45 and 46 as a mask and a selective etching.

FIG. 15J and FIG. 15K are cross-sectional views each pictorially showing in part a modification of the third method of manufacturing the magnetic memory device according to the first embodiment. In the modification, manufacturing steps of FIG. 15J and FIG. 15K are performed after the above described manufacturing steps of FIG. 15A to FIG. 15F.

In the above described third manufacturing method, the insulating film 46 is formed on side surfaces of the lower layer portion 23a and the middle layer portion 23c of the reference layer 23 and the insulating film 45 in the step of FIG. 15G. In the modification, the insulating film 46 is formed only on the side surface of the lower layer portion 23a of the reference layer 23 as shown in FIG. 15J. After the step of FIG. 15J, the stacked layer structure 20 including the inactive portion 46a can be obtained by etching the tunnel barrier layer 24 and the storage layer 21 as shown in FIG. 15K.

In the present modification, too, the storage layer 21, the shift canceling layer 22, and the reference layer 23 have a relationship as shown in FIG. 15I. That is, a side surface of the storage layer 21 is located outside a side surface of the shift canceling layer 22 and a side surface of the reference layer 23 as viewed from a direction perpendicular to a main surface of the storage layer 21.

Figure 16:
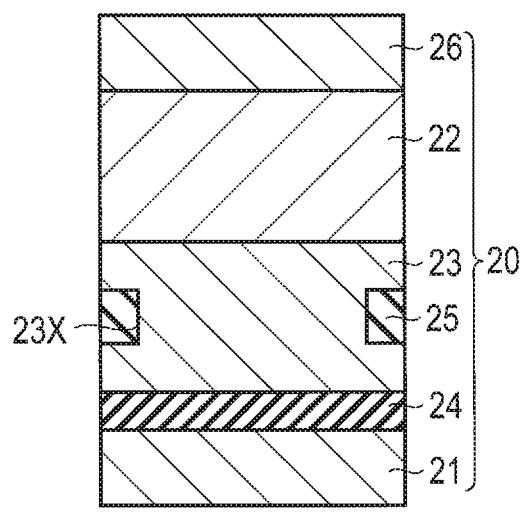
FIG. 16 is a cross-sectional view pictorially showing a first modified configuration example of the magnetic memory device according to the first embodiment.
Figure 17:
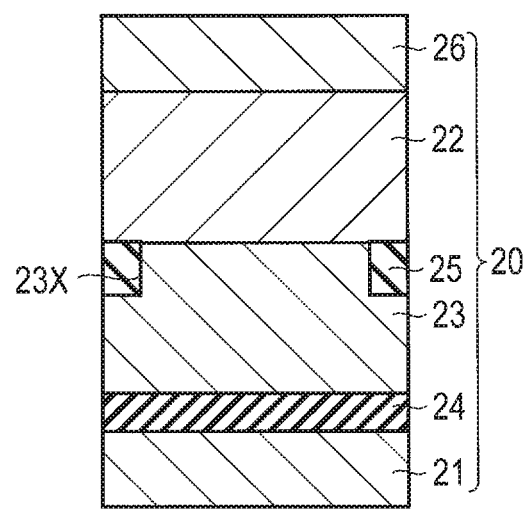
FIG. 17 is a cross-sectional view pictorially showing a second modified configuration example of the magnetic memory device according to the first embodiment.

In the above-explained embodiment, the recess portion 23x is provided at the lowermost part of the side surface of the reference layer 23, but the position of the recess portion 23x can be changed. As illustrated in a first modified example shown in FIG. 16, the recess portion 23x may be provided at a central part of the side surface of the reference layer 23. In addition, as illustrated in a second modified example in FIG. 17, the recess portion 23x may be provided at an uppermost part of the side surface of the reference layer 23. Furthermore, a plurality of recess portions 23x may be provided at the side surface of the reference layer 23. In other words, at least one recess portion 23x may be partially provided at the side surface of the reference layer 23 in the present embodiment.

Second Embodiment

Next, a second embodiment will be explained. Basic elements are the same as those of the first embodiment, and the elements explained in the first embodiment are not explained here.

Figure 18:
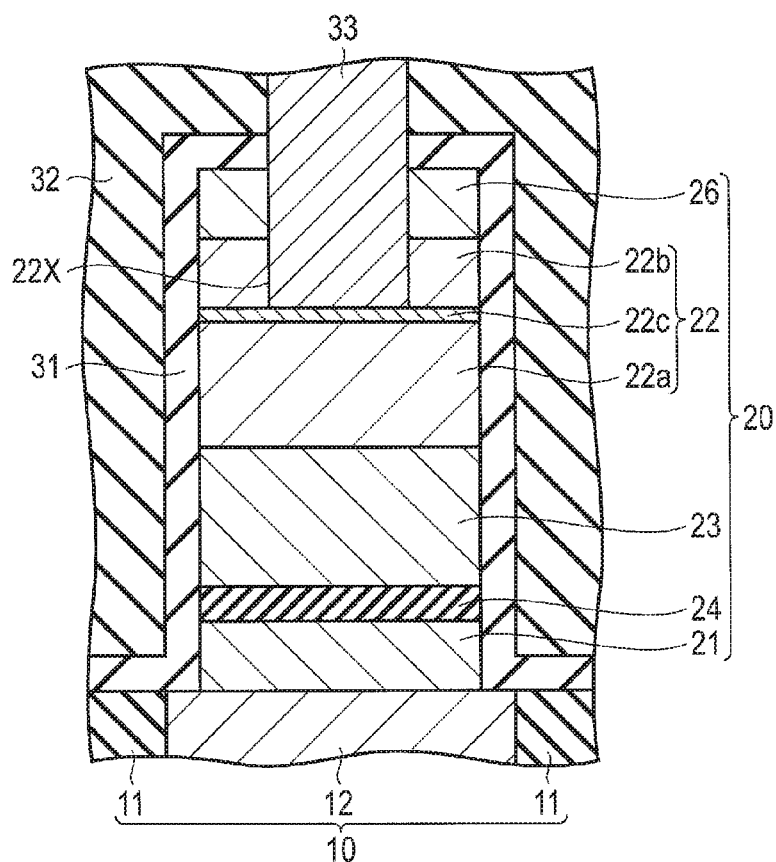
FIG. 18 is a cross-sectional view schematically showing a configuration of a magnetic memory device according to the second embodiment.

FIG. 18 is a cross-sectional view schematically showing a configuration of a magnetic memory device according to the second embodiment. Since the basic constituent elements are the same as those of the first embodiment shown in FIG. 1, the elements explained in the first embodiment are not explained here.

In the present embodiment, too, a stacked layer structure 20 which functions as a magnetoresistive element is provided on an underlying region 10 including an interlayer insulating film 11 and a bottom electrode 12, similarly to the first embodiment. The stacked layer structure 20 includes a storage layer (first magnetic layer) 21, a shift canceling layer (second magnetic layer) 22, a reference layer (third magnetic layer) 23 provided between the storage layer 21 and the shift canceling layer 22, a tunnel barrier layer (nonmagnetic layer) 24 provided between the storage layer 21 and the reference layer 23, and a top layer (cap layer or hard mask layer) 26 provided on the shift canceling layer 22.

In the present embodiment, a top surface of the shift canceling layer 22 includes a recess portion 22x. In other words, the top surface of the shift canceling layer 22 is partially recessed. In the shift canceling layer 22, a central part is therefore thinner than an outer peripheral part. In the recess portion 22x provided at the top surface of the shift canceling layer 22, a part of a top electrode 33 electrically connected to the shift canceling layer 22 is provided as an inactive portion which is formed of a conductive material (for example, metal) and is magnetically inactive.

Figure 19:
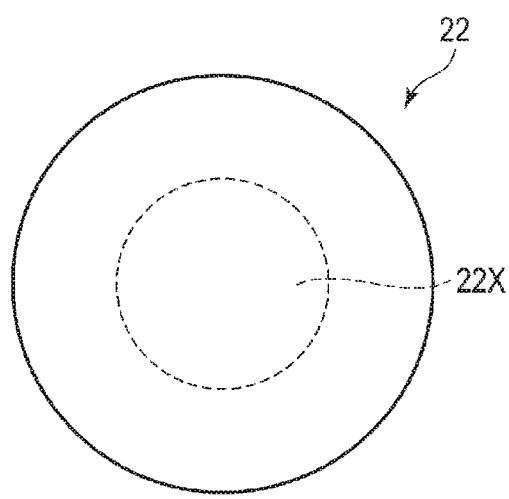
FIG. 19 is a plan view pictorially showing a relationship between a shift canceling layer and a recess portion, in the magnetic memory device according to the second embodiment.

FIG. 19 is a plan view pictorially showing a relationship between the shift canceling layer 22 and the recess portion 22x. As shown in FIG. 19, the recess portion 22x is provided at a central part of the shift canceling layer 22 as viewed from a direction perpendicular to the main surface of the shift canceling layer 22.

The shift canceling layer 22 includes a lower layer portion 22a, an upper layer portion 22b, and a middle layer portion 22c provided between the lower layer portion 22a and the upper layer portion 22b. The middle layer portion 22c is formed of a material different from a material of the lower layer portion 22a and a material of the upper layer portion 22b. In the present embodiment, the middle layer portion 22c contains tantalum (Ta) or ruthenium (Ru). More specifically, the middle layer portion 22c is formed of a Ta film or a Ru film. The middle layer portion 22c functions as an etching stopper when the recess portion 22x is formed in the shift canceling layer 22. For this reason, a bottom surface of the recess portion 22x is defined by the middle layer portion 22c. In addition, since the middle layer portion 22c is used as an etching stopper, the middle layer portion 22c is formed of a material different from a material of the top layer 26. For example, the middle layer portion 22c is formed of Ru if the top layer 26 is formed of Ta, and the middle layer portion 22c is formed of Ta if the top layer 26 is formed of Ru.

A spin-transfer-torque (STT) magnetoresistive element is constituted by the stacked layer structure 20 including the storage layer 21, the shift canceling layer 22, the reference layer 23, the tunnel barrier layer 24, and the top layer 26.

The stacked layer structure 20 is covered with a protective insulating film 31 and an interlayer insulating film 32. A top electrode 33 is provided in a hole formed in the interlayer insulating film 32, the protective insulating film 31, the top layer 26 and an upper layer portion 22b of the shift canceling layer 22.

Figure 20:
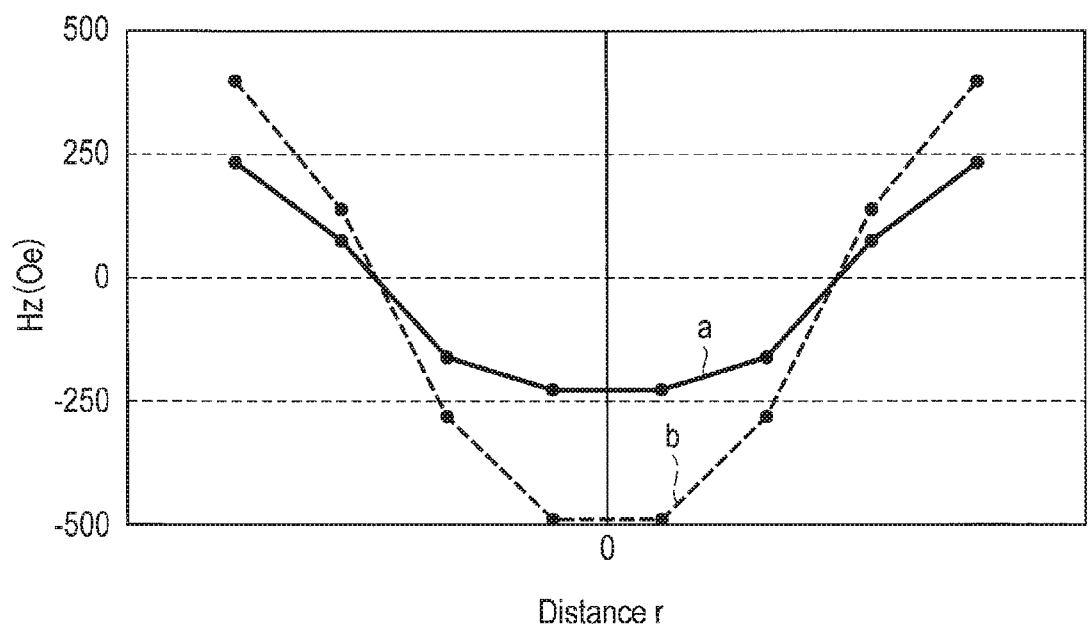
FIG. 20 is a graph showing a spatial distribution of a stray magnetic field in the magnetic memory device according to the second embodiment.

FIG. 20 is a graph showing a spatial distribution of a stray magnetic field in the magnetic memory device according to the present embodiment. More specifically, the figure shows a magnetic field intensity distribution corresponding to a difference between the magnetic field applied from the shift canceling layer 22 to the storage layer 21 (i.e., the magnetic field in the direction perpendicular to the main surface of the storage layer 21) and the magnetic field applied from the reference layer 23 to the storage layer 21 (i.e., the magnetic field in the direction perpendicular to the main surface of the storage layer 21). The horizontal axis indicates a distance from a center (r=0) of the main surface of the storage layer 21 and the vertical axis indicates the magnetic field intensity. Characteristic "a" indicates the magnetic field intensity distribution in the present embodiment (in which the recess portion 22x is provided at the top surface of the shift canceling layer 22 and the top electrode 33 is provided in the recess portion 22x as an inactive portion), and characteristic "b" indicates the magnetic field intensity distribution in a comparative example (in which the recess portion 22x is not provided at the top surface of the shift canceling layer 22).

As shown in FIG. 20, the variation in the magnetic field intensity in the present embodiment (characteristic "a") is reduced more significantly than that in the comparative example (characteristic "b"). The variation in intensity of the magnetic field applied from the shift canceling layer 22 and the reference layer 23 to the storage layer 21 can be therefore reduced by employing the constitution of the present embodiment.

Thus, in the magnetic memory device of the present embodiment, the recess portion 22x is provided at the top surface of the shift canceling layer 22 and the top electrode 33 is provided in the recess portion 22x as the inactive portion which is magnetically inactive. In the constitution of the present embodiment, the variation in intensity of the magnetic field applied from the shift canceling layer 22 and the reference layer 23 to the storage layer 21 can be reduced and the distribution of the magnetic field applied to the storage layer 21 can be improved significantly. A magnetic memory device having excellent characteristics can be therefore obtained by using the configuration of the present embodiment, similarly to the first embodiment.

Figure 23:
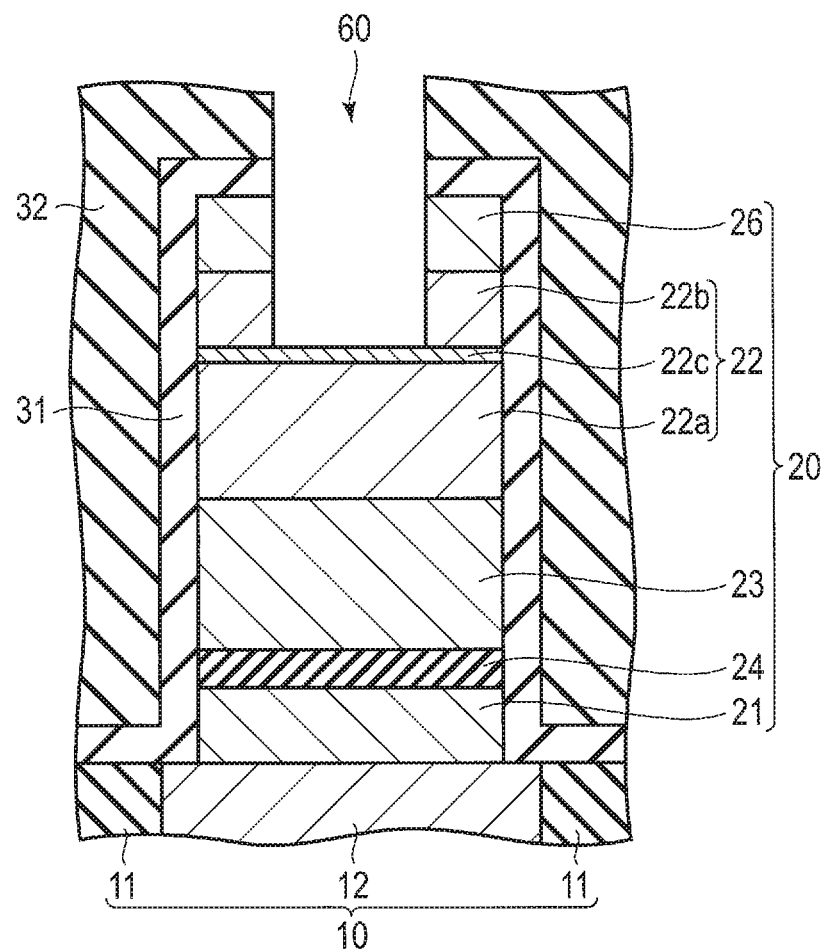
FIG. 23 is a cross-sectional view pictorially showing in part the method of manufacturing the magnetic memory device according to the second embodiment.

Next, a method of manufacturing the magnetic memory device according to the present embodiment will be explained. FIG. 21 to FIG. 23 are cross-sectional views pictorially showing the manufacturing method of the present embodiment.

First, as shown in FIG. 21, the storage layer 21, the tunnel barrier layer 24, the reference layer 23, the shift canceling layer 22 and the top layer 26 are formed on the underlying region 10. The shift canceling layer 22 includes a lower layer portion 22a, an upper layer portion 22b, and a middle layer portion 22c. Subsequently, the top layer 26 is patterned, and the storage layer 21, the tunnel barrier layer 24, the reference layer 23, and the shift canceling layer 22 are etched by using the patterned top layer 26 as a mask. The stacked layer structure 20 is thereby formed.

Next, as shown in FIG. 22, the protective insulating film 31 and the interlayer insulating film 32 are formed to cover the stacked layer structure 20.

Next, as shown in FIG. 23, the interlayer insulating film 32, the protective insulating film 31, the top layer 26 and the upper layer portion 22b of the shift canceling layer 22 are patterned to form a hole 60. At this time, the middle layer portion 22c of the shift canceling layer 22 functions as an etching stopper. For this reason, the hole 60 having a desired depth can be formed by adjusting the position of the middle layer portion 22c.

After that, the magnetic memory device as shown in FIG. 18 can be obtained by forming the top electrode 33 in the hole 60.

Thus, in the above-explained manufacturing method, the hole 60 having a desired depth (i.e., the desired recess portion 22x) can be formed with good controllability, by providing the middle layer portion 22c in the shift canceling layer 22 and using the middle layer portion 22c as an etching stopper.

In the above-explained embodiment, the top surface of the shift canceling layer 22 includes the recess portion 22x, but the position of the recess portion 22x can be changed. As shown in a modified example of FIG. 24, the recess portion 22x may be formed at the bottom surface of the shift canceling layer 22. In this case, too, an inactive portion 34 which is formed of a conductive material and magnetically inactive is desirably provided in the recess portion 22x.

FIG. 25 is an equivalent circuit diagram showing a configuration of a magnetic memory device (semiconductor integrated circuit device) using the magnetoresistive elements of the first and second embodiments.

As shown in FIG. 25, series circuit units of the magnetoresistive elements MTJ and the MOS transistors TR are arrayed. A first bit line BL1 is connected to one of ends of each series circuit unit, and a second bit line BL2 is connected to the other end of each series circuit unit. A word line WL is connected to a gate electrode of each MOS transistor TR.

A magnetic memory device having excellent characteristics can be obtained by constituting the magnetic memory device (semiconductor integrated circuit device) as shown in FIG. 25 using the magnetoresistive elements of the first and second embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
 a first magnetic layer selectively exhibiting a first state in which the first magnetic layer has a first magnetization direction perpendicular to a main surface thereof and a second state in which the first magnetic layer has a second magnetization direction opposite to the first magnetization direction;
 a second magnetic layer having a fixed magnetization direction which is perpendicular to a main surface thereof and which corresponds to the first magnetization direction;
 a third magnetic layer provided between the first magnetic layer and the second magnetic layer, the third magnetic layer having a fixed magnetization direction which is perpendicular to a main surface thereof and which corresponds to the second magnetization direction, and having a side surface including a recess portion; and
 a nonmagnetic layer provided between the first magnetic layer and the third magnetic layer,
 wherein the side surface of the third magnetic layer except the recess portion aligns with a side surface of the first magnetic layer.

2. The device of claim 1, further comprising:
 an inactive portion provided in the recess portion, the inactive portion being magnetically inactive.

3. The device of claim 2, wherein the inactive portion is formed of an oxide.

4. The device of claim 2, wherein the inactive portion is formed of an oxide of a material used for the third magnetic layer.

5. The device of claim 2, wherein the inactive portion has an amorphous structure and is formed of a material substantially the same as a material used for the third magnetic layer.

6. The device of claim 2, wherein the inactive portion is in contact with the nonmagnetic layer.

7. The device of claim 1, wherein an inner surface of the recess portion is defined by the third magnetic layer and the nonmagnetic layer.

8. The device of claim 1, wherein the recess portion has a ring shape when viewed from a direction perpendicular to the main surface of the third magnetic layer.

9. The device of claim 1, wherein the side surface of the third magnetic layer except the recess portion aligns with a side surface of the second magnetic layer.

10. The device of claim 1, wherein a structure including the first magnetic layer, the second magnetic layer, the third magnetic layer and the nonmagnetic layer constitutes a spin-transfer-torque (STT) magnetoresistive element.

11. A magnetic memory device comprising:
 a first magnetic layer selectively exhibiting a first state in which the first magnetic layer has a first magnetization direction perpendicular to a main surface thereof and a second state in which the first magnetic layer has a second magnetization direction opposite to the first magnetization direction;
 a second magnetic layer having a fixed magnetization direction which is perpendicular to a main surface thereof and which corresponds to the first magnetization direction;
 a third magnetic layer provided between the first magnetic layer and the second magnetic layer, the third magnetic layer having a fixed magnetization direction which is perpendicular to a main surface thereof and which corresponds to the second magnetization direction, and having a side surface including a recess portion;
 a nonmagnetic layer provided between the first magnetic layer and the third magnetic layer; and
 an inactive portion provided in the recess portion, the inactive portion being magnetically inactive, wherein the inactive portion has an amorphous structure and is formed of a material substantially the same as a material used for the third magnetic layer.

12. The device of claim 11, wherein an inner surface of the recess portion is defined by the third magnetic layer and the nonmagnetic layer.

13. The device of claim 11, wherein the recess portion has a ring shape when viewed from a direction perpendicular to the main surface of the third magnetic layer.

14. The device of claim 11, wherein the side surface of the third magnetic layer except the recess portion aligns with a side surface of the second magnetic layer.

15. The device of claim 11, wherein a structure including the first magnetic layer, the second magnetic layer, the third magnetic layer and the nonmagnetic layer constitutes a spin-transfer-torque (STT) magnetoresistive element.

16. A magnetic memory device comprising:
a first magnetic layer selectively exhibiting a first state in which the first magnetic layer has a first magnetization direction perpendicular to a main surface thereof and a second state in which the first magnetic layer has a second magnetization direction opposite to the first magnetization direction;
a second magnetic layer having a fixed magnetization direction which is perpendicular to a main surface thereof and which corresponds to the first magnetization direction;
a third magnetic layer provided between the first magnetic layer and the second magnetic layer, the third magnetic layer having a fixed magnetization direction which is perpendicular to a main surface thereof and which corresponds to the second magnetization direction, and having a side surface including a recess portion; and
a nonmagnetic layer provided between the first magnetic layer and the third magnetic layer,
wherein a side surface of the first magnetic layer is located outside a side surface of the second magnetic layer and the side surface of the third magnetic layer when viewed from a direction perpendicular to the main surface of the first magnetic layer.

17. The device of claim 16, further comprising:
an inactive portion provided in the recess portion, the inactive portion being magnetically inactive.

18. The device of claim 16, wherein an inner surface of the recess portion is defined by the third magnetic layer and the nonmagnetic layer.

19. The device of claim 16, wherein the recess portion has a ring shape when viewed from a direction perpendicular to the main surface of the third magnetic layer.

20. The device of claim 16, wherein a structure including the first magnetic layer, the second magnetic layer, the third magnetic layer and the nonmagnetic layer constitutes a spin-transfer-torque (STT) magnetoresistive element.

* * * * *